United States Patent [19]
Okazaki

[11] Patent Number: 5,214,330
[45] Date of Patent: May 25, 1993

[54] BI-DIRECTIONAL SIGNAL BUFFERING CIRCUIT

[75] Inventor: Yoshihiko Okazaki, Tokyo, Japan

[73] Assignee: Kabushiki Kaisha toshiba, Kariya, Japan

[21] Appl. No.: 855,530

[22] Filed: Mar. 20, 1992

[30] Foreign Application Priority Data

Jul. 30, 1991 [JP] Japan .................................. 3-190217

[51] Int. Cl.⁵ .......................................... H03K 19/01
[52] U.S. Cl. .................................. 307/443; 307/473; 307/475; 307/242
[58] Field of Search ............ 307/443, 473, 475, 296.1, 307/241–243

[56] References Cited
U.S. PATENT DOCUMENTS

| | | | |
|---|---|---|---|
| 3,769,525 | 10/1973 | Foss et al. | 307/241 X |
| 4,154,978 | 5/1979 | Tu | 307/443 X |
| 4,315,167 | 2/1982 | Pelc | 307/443 X |
| 4,419,592 | 12/1983 | Norgren et al. | 307/242 X |
| 4,446,382 | 5/1984 | Moore et al. | 307/443 X |
| 4,621,202 | 11/1986 | Pumo | 307/242 X |
| 4,695,740 | 9/1987 | Carter | 307/242 |
| 4,835,418 | 5/1989 | Hsieh | 307/475 X |
| 4,987,319 | 1/1991 | Kawana | 307/473 X |
| 5,107,148 | 4/1992 | Millman | 307/242 X |

Primary Examiner—David R. Hudspeth
Attorney, Agent, or Firm—Cushman, Darby & Cushman

[57] ABSTRACT

When a signal A is input to a bi-directional buffer from a bus A, a first buffer detects the level of the signal A and supplies an OE control signal to a second buffer to disable an output therefrom. The output from the second buffer is set to a predetermined value by a bias circuit, and this predetermined value is supplied to the bi-directional buffer as a direction control signal via a direction designator together with output signal from the first buffer. In this circuit operation, when the signal A is input to the bi-directional buffer, it is immediately transmitted from the bus A side to the bus B side since the bi-directional buffer is set in an initial state by the bias circuit so as to transmit a signal in two directions.

10 Claims, 2 Drawing Sheets

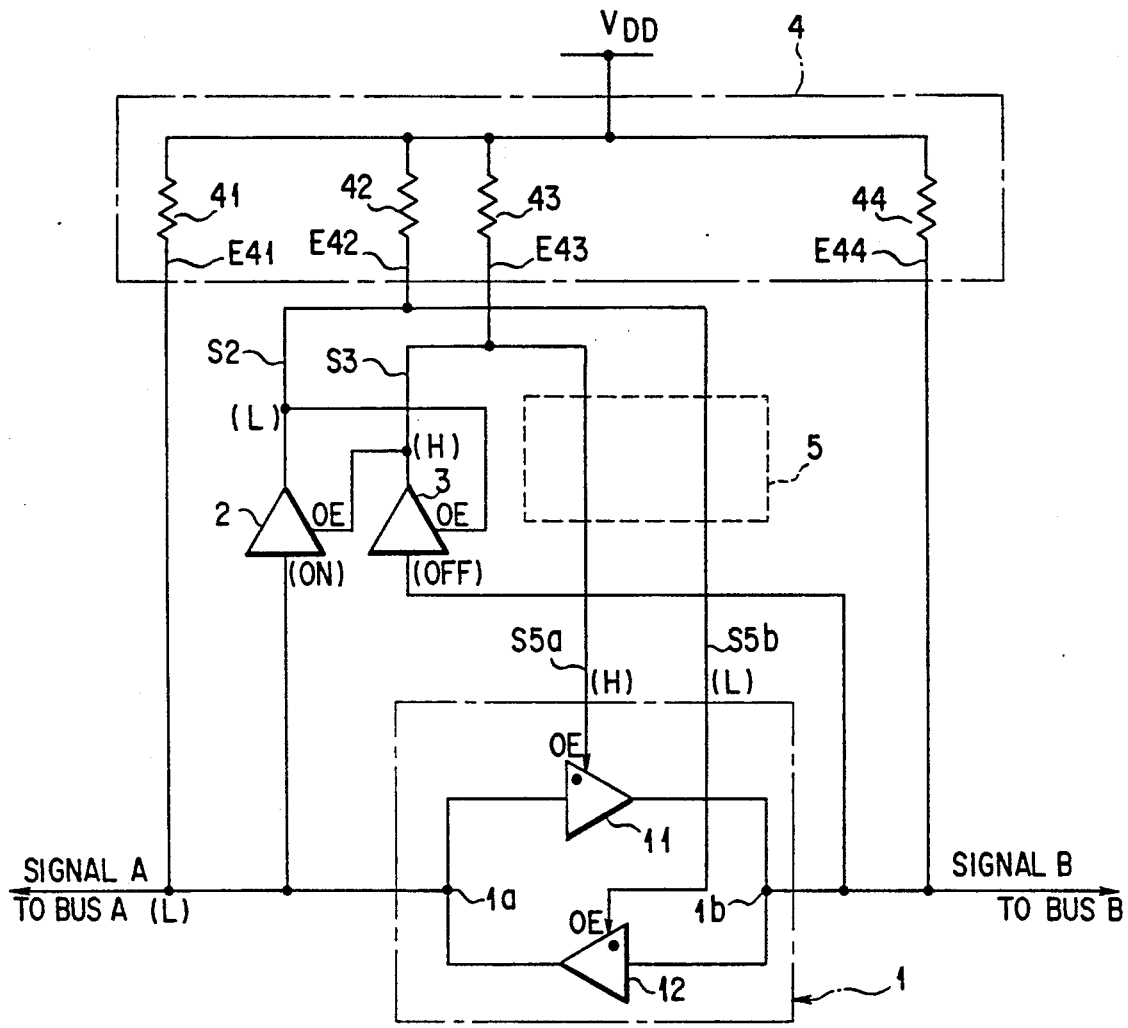
F I G. 2

BI-DIRECTIONAL SIGNAL BUFFERING CIRCUIT

BACKGROUND OF THE INVENTION

1. Field of the Invention

The present invention relates to a signal buffering circuit for extending signal lines of a digital circuit.

2. Description of the Related Art

In a digital circuit, to extend signal lines, e.g., buses, buffering by using a bi-directional buffer is performed.

To transmit a signal in two directions by using the bi-directional buffer, buffering direction control of the bi-directional buffer and OE (Output Enabling) control are performed. In this case, a drive direction is detected first, and then direction control and OE control are performed. Therefore, signal transmission takes time.

SUMMARY OF THE INVENTION

It is, therefore, an object of the present invention to provide a bi-directional signal buffering circuit which can increase the processing speed of signal transmission in a bi-directional buffer.

In order to achieve the above object, according to the present invention, there is provided a signal buffering circuit comprising: an open collector or open drain type bi-directional buffer which transmits a signal in two directions and a signal transmission direction of which can be controlled; a buffer circuit having first and second buffers, the first buffer receiving as an input a signal (A) of one direction supplied to the bi-directional buffer and having an input terminal connected to one terminal of the bi-directional buffer, the second buffer receiving as an input a signal (B) of the other direction supplied to the bi-directional buffer and having an input terminal connected to the other terminal of the bi-directional buffer, and the first and second buffers outputting output signals which are supplied to each other as output enable (OE) signal control signals; a bias circuit for supplying a DC bias voltage to the two terminals of the bi-directional buffer and the first and second buffers; and a direction designator for controlling the signal transmission direction of the bi-directional buffer by an output signal from the buffer circuit.

When a signal (A) is input to the bi-directional buffer from the first buffer side, the first buffer detects this signal (A) and supplies an output enable (OE) control signal to the second buffer to disable an output from the second buffer. The output from the second buffer is set to a predetermined bias value by the bias circuit. The predetermined bias value is supplied to the bi-directional buffer as a direction control signal together with the output signal from the first buffer.

In this circuit operation, when the signal (A) is input to the bi-directional buffer, it is immediately transmitted from the first buffer side to the second buffer side as the bi-directional buffer can transmit a signal in two directions in an initial state.

When the signal (B) is input to the bi-directional buffer from the second buffer side, the second buffer detects the signal (B) and control is performed in the same manner as described above.

That is, in the circuit according to the present invention, since transmission direction detection and output enabling control are performed simultaneously, the processing speed of signal transmission in the bi-directional buffer is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a practical arrangement of a signal buffering circuit according to an embodiment of the present invention.

DETAILED DESCRIPTION OF THE PREFERRED EMBODIMENTS

Figure 1:
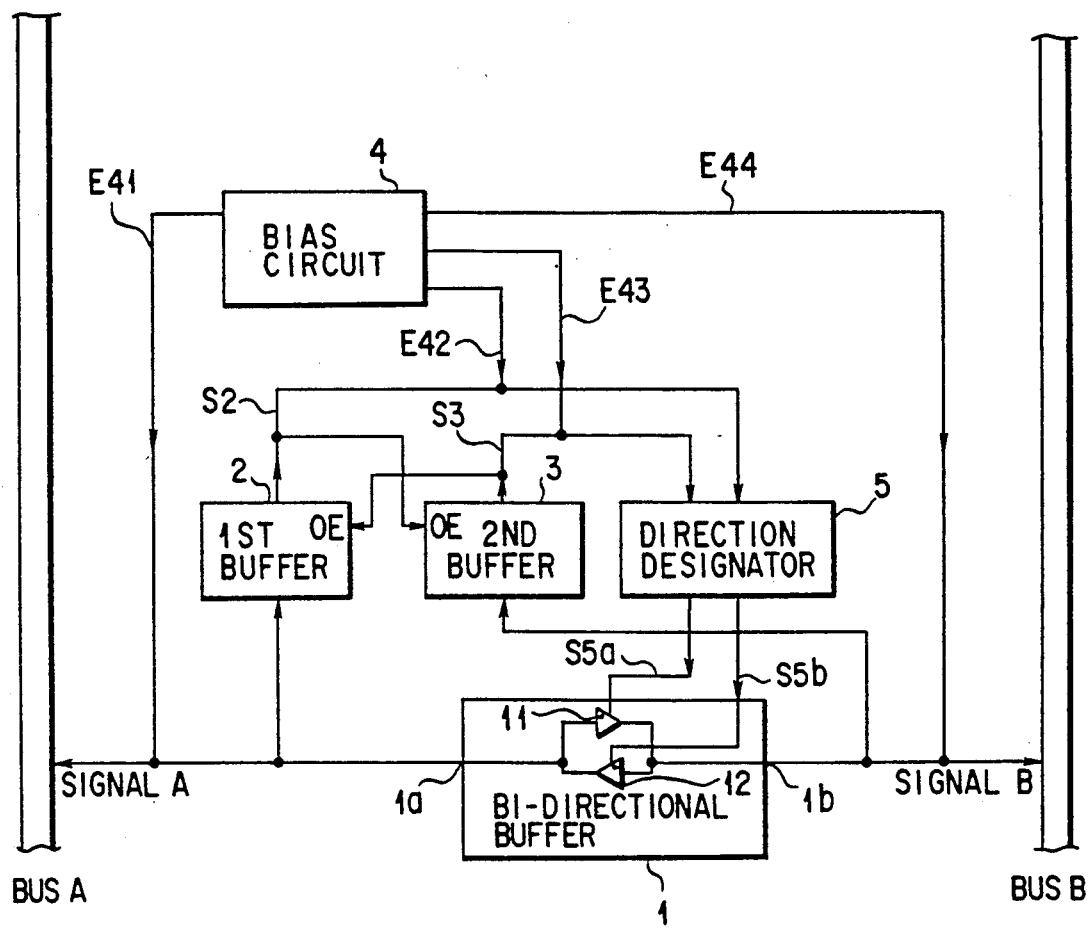
FIG. 1 is a block diagram showing a basic arrangement of a signal buffering circuit according to the present invention.

An embodiment of the present invention will be described with reference to the accompanying drawings.

FIG. 1 shows a basic arrangement of a signal buffering circuit according to the present invention. Bi-directional buffer 1 has two tri-state buffers each having an open collector type bipolar transistor output circuit and can perform signal transmission direction control and OE control.

One terminal 1a of bi-directional buffer 1, i.e., a terminal portion to which signal A is supplied from bus A is connected to an input terminal of first buffer 2 and the first output terminal of bias circuit 4. Similarly, other terminal 1b of bi-directional buffer 1, i.e., the other terminal portion to which signal B is supplied from bus B is connected to an input terminal of second buffer 3 and the fourth output terminal of bias circuit 4. Both first and second buffers 2 and 3 are capable of performing OE control in accordance with an input signal level, and buffer signals A and B at terminal portions 1a and 1b of bi-directional buffer 1. First and second buffers 2 and 3 can comprise open collector type tri-state buffers.

The second and third output terminals of bias circuit 4 are connected to the output terminals of first and second buffers 2 and 3 in order to supply DC bias voltages E41 to E44, respectively, to terminals 1a and 1b of bi-directional buffer 1 and to first and second buffers 2 and 3. The output terminals of first and second buffers 2 and 3 are cross-coupled to OE control terminals of buffers 3 and 2, respectively. The output terminals of first and second buffers 2 and 3 are also respectively connected to OE control terminals of open collector buffers 11 and 12 of bi-directional buffer 1 via direction designator 5.

An operation of the signal buffering circuit shown in FIG. 1 will be described.

As bias voltages E42 and E43 are supplied to bi-directional buffer 1, when neither signal A nor B are supplied to it, OE control signals S5a and S5b for buffers 11 and 12 in buffer 1 are ON or enabled (H). For this reason, when, e.g., signal A is supplied from bus A to drive terminal 1a, signal A is immediately transmitted to bus B. At this time, since signal transmission is delayed in buffer 11, an input to first buffer 2 is earlier than an input to second buffer 3. Then, first buffer 2 is turned on (S2=L) first, OE control of second buffer 3 is thus disabled, and an output from second buffer 3 becomes open (S3=H). These outputs (S2=L and S3=H) are input to direction designator 5. As a result, direction designator 5 outputs a signal (S5b=L) to disable buffer 12.

In this manner, when driving of terminal 1a on signal A side is controlled to be completed, driving of terminal 1b on signal B side is also controlled to be completed.

Similarly, when terminal 1b on signal B side is driven, signal B is transmitted to bus A.

That is, when signal A is input to bi-directional buffer 1 from bus A, first buffer 2 detects the level (L) of signal A and supplies an OE control signal (S2=L) to second buffer 3 to disable (to open the collector) output S3 therefrom. Output S3 from second buffer 3 is set to a predetermined value (VDD=H) by bias circuit 4, and this value (S3=VDD=H) is supplied to bi-directional buffer 1 as a direction control signal via direction designator 5 together with output signal S2 (=L) from first buffer 2. In this circuit operation, when signal A is input to bi-directional buffer 1, it is immediately transmitted from the bus A side to the bus B side as bi-directional buffer 1 is set in an initial state by bias circuit 4 to transmit a signal in two directions.

FIG. 2 shows a practical embodiment of a signal buffering circuit according to the present invention. In this embodiment, the circuit operates with negative logic (active low). Bi-directional buffer 1 has open collector type buffers 11 and 12 which are anti-parallel-connected to each other. First and second buffers respectively comprise OE controllable buffers 2 and 3. Bias circuit 4 comprises four bias resistors 41, 42, 43, and 44 which pull up input/output terminals of buffers 2 and 3 to power supply VDD. Bias circuit 4 can comprise only resistors 42 and 43 by omitting resistors 41 and 44.

An operation of the circuit having the above arrangement will be described. When, e.g., signal A goes L first, as shown in FIG. 2, output signal S2 from buffer 2 goes L. Output signal S2 (=L) is input to the OE control terminal of buffer 3. Then, buffer 3 is turned off and output signal S3 thereof goes H. Output signal S2 (=L) is also input to the OE control terminal of buffer 12 to turn it off. Since output signal S3 (=H) from buffer 3 is input to buffer 11, buffer 11 is kept ON. As a result, signal A is transmitted to the bus B side via buffer 11.

Inversely, when signal B goes L first, output signal S3 from buffer 3 goes L. Output signal S3 (=L) is input to the OE control terminal of buffer 2. Buffer 2 is thus turned off and output signal S2 thereof goes H. Output signal S3 (=L) from buffer 3 is also input to the OE control terminal of buffer 11 to turn it off. As a result, signal B is transmitted to the bus A side via buffer 12.

As has been described above, according to the present invention, buffering direction control of the bi-directional buffer and OE control can be easily performed without a special signal other than signals A and B to be transmitted. The entire arrangement can thus be simplified.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A bi-directional signal buffering circuit coupled to first and second buses, comprising:

means, responsive to a first signal supplied from the first bus and a second signal supplied from the second bus, for generating a third signal corresponding to the first signal and a fourth signal corresponding to the second signal;

bi-directional transmitting means, inserted between said first and second buses, and responsive to the third and fourth signals for transmitting the first signal supplied from the first bus to the second bus and the second signal supplied from the second bus to the first bus; and means for setting an operation state of said bi-directional transmitting means so as to enable signal transmission from said first bus to said second bus and that from said second bus to said first bus via said bi-directional transmitting means when neither the first nor second signal are supplied to said bi-directional transmitting means.

2. A circuit according to claim 1, wherein said bi-directional transmitting means includes:

first buffer means, having a first input terminal connected to said first bus and a first output terminal connected to said second bus, for transmitting the first signal to said second bus when the fourth signal is generated and circuit-opening said first output terminal when the fourth signal is not generated; and second buffer means, having a second input terminal connected to said second bus and a second output terminal connected to said first bus, for transmitting the second signal to said first bus when the third signal is generated and circuit-opening said second output terminal when the third signal is not supplied thereto.

3. A circuit according to claim 2, wherein said generating means includes:

third buffer means, having an input terminal for receiving the first signal and an output terminal for providing the third signal, for supplying the third signal corresponding to the first signal to said second buffer means when the fourth signal is generated and circuit-opening the output terminal thereof when the fourth signal is not generated; and fourth buffer means, having an input terminal for receiving the second signal and an output terminal for providing the fourth signal, for supplying the fourth signal corresponding to the second signal to said first buffer means when the third signal is generated and circuit-opening the output terminal thereof when the third signal is not generated.

4. A circuit according to claim 2, wherein said setting means includes first bias means for supplying a first bias signal to said first and second buffer means so as to enable signal transmission from said first bus to said second bus and that from said second bus to said first bus via said bi-directional transmitting means.

5. A circuit according to claim 4, wherein said setting means further includes second bias means for supplying a second bias signal to said first and second buses, the operation state of said bi-directional transmitting means being set by the first and second bias signals when neither the first nor second signal are supplied to said bi-directional transmitting means.

6. A circuit according to claim 3, wherein said first buffer means includes a first tri-state buffer having an input terminal connected to said first bus, an open collector type output terminal connected to said second bus, and an output enable terminal connected to said output terminal of said fourth buffer means, and said second buffer means includes a second tri-state buffer having an input terminal connected to said second bus, an open collector type output terminal connected to said first bus, and an output enable terminal connected to said output terminal of said third buffer means.

7. A circuit according to claim 6, wherein said third buffer means includes a third tri-state buffer having an input terminal connected to said first bus, an open collector type output terminal connected to said output enable terminal of said second tri-state buffer, and an output enable terminal connected to said output terminal of said fourth buffer means, and said fourth buffer means includes a fourth tri-state buffer having an input terminal connected to said second bus, an open collector type output terminal connected to said output enable terminal of said first tri-state buffer, and an output enable terminal connected to said output terminal of said third buffer means.

8. A circuit according to claim 6, wherein said setting means includes:

a first bias circuit for applying a first bias potential to said output enable terminal of said first tri-state buffer; and a second bias circuit for applying a second bias potential to said output enable terminal of said second tri-state buffer.

9. A circuit according to claim 7, wherein said setting means includes:

a first bias circuit for applying a first bias potential to said output enable terminal of said first tri-state buffer;

a second bias circuit for applying a second bias potential to said output enable terminal of said second tri-state buffer;

a third bias circuit for applying a third bias potential to said input terminal of said third tri-state buffer; and a fourth bias circuit for applying a fourth bias potential to said input terminal of said fourth tri-state buffer.

10. A signal processing apparatus comprising:

an open collector or open drain type bi-directional buffer which transmits a signal in two directions and a signal transmission direction of which can be controlled;

a buffer having first and second buffers, said first buffer receiving as an input a signal of one direction supplied to said bi-directional buffer and having an input terminal connected to one terminal of said bi-directional buffer, said second buffer receiving as an input a signal of the other direction supplied to said bi-directional buffer and having an input terminal connected to the other terminal of said bi-directional buffer, and said first and second buffers outputting output signals which are supplied to each other as output enable signal control signals;

a bias circuit for supplying a DC bias voltage to said two terminals of said bi-directional buffer and said first and second buffers; and a direction designator for controlling the signal transmission direction of said bi-directional buffer by an output signal from said buffer.

* * * * *